United States Patent
Wiberg et al.

(10) Patent No.: US 12,034,454 B2
(45) Date of Patent: Jul. 9, 2024

(54) VERIFYING DATA INTEGRITY IN A RECEIVER

(71) Applicant: Telefonaktiebolaget LM Ericsson (publ), Stockholm (SE)

(72) Inventors: Niclas Wiberg, Linköping (SE); Martin Hessler, Linköping (SE)

(73) Assignee: Telefonaktiebolaget LM Ericsson (Publ), Stockholm (SE)

(*) Notice: Subject to any disclaimer, the term of this patent is extended or adjusted under 35 U.S.C. 154(b) by 22 days.

(21) Appl. No.: 17/909,931

(22) PCT Filed: Mar. 5, 2021

(86) PCT No.: PCT/EP2021/055684
§ 371 (c)(1),
(2) Date: Sep. 7, 2022

(87) PCT Pub. No.: WO2021/190906
PCT Pub. Date: Sep. 30, 2021

(65) Prior Publication Data
US 2023/0104186 A1    Apr. 6, 2023

Related U.S. Application Data

(60) Provisional application No. 62/993,152, filed on Mar. 23, 2020.

(51) Int. Cl.
*H03M 13/09* (2006.01)
*H04L 1/00* (2006.01)

(52) U.S. Cl.
CPC .......... *H03M 13/09* (2013.01); *H04L 1/0061* (2013.01)

(58) Field of Classification Search
CPC . H03M 13/09; H03M 13/1137; H04L 1/0057; H04L 1/0061
See application file for complete search history.

(56) References Cited

U.S. PATENT DOCUMENTS

| 5,657,331 A | 8/1997 | Metzner et al. |
| 7,039,854 B1 | 5/2006 | Ireland et al. |

(Continued)

FOREIGN PATENT DOCUMENTS

| EP | 3577767 | 8/2018 |
| WO | 03065591 A2 | 8/2003 |
| WO | 2016050323 A1 | 4/2016 |

OTHER PUBLICATIONS

International Search Report and Written Opinion dated Jun. 14, 2021 for International Application No. PCT/EP2021/055684 filed Mar. 5, 2021; consisting of 10 pages.

(Continued)

*Primary Examiner* — Shelly A Chase
(74) *Attorney, Agent, or Firm* — Weisberg I.P. Law, P.A.

(57) ABSTRACT

A method for verifying data integrity in a receiver in a wireless communication network is disclosed. The method includes receiving a data message, wherein the data message includes a group of data elements and a checksum, computing a complete syndrome vector based on partial syndrome vectors, wherein the partial syndrome vectors are computed, in parallel, by multiplying part of a parity-check matrix with corresponding part of the received data message, determining that all vector elements of the complete syndrome vector are zero, and verifying that the received data message is correct when all the vector elements of the complete syndrome vector are zero, and incorrect otherwise. Corresponding computer program product, apparatus, and receiver are also disclosed.

20 Claims, 5 Drawing Sheets

(56) References Cited

U.S. PATENT DOCUMENTS

| | | | |
|---|---|---|---|
| 7,831,884 | B2 | 11/2010 | Spencer |
| 2002/0188906 | A1 | 12/2002 | Kurtas et al. |
| 2005/0166040 | A1 | 7/2005 | Walmsley |
| 2008/0168323 | A1 | 7/2008 | Clark et al. |
| 2012/0054585 | A1 | 3/2012 | Jiang et al. |
| 2013/0031440 | A1* | 1/2013 | Sharon ............ G06F 11/1012 714/E11.032 |
| 2013/0055050 | A1 | 2/2013 | Uchikawa |
| 2015/0089282 | A1 | 3/2015 | Taranta, II |
| 2016/0026527 | A1* | 1/2016 | Marov ............ H03M 13/154 714/764 |
| 2016/0043829 | A1 | 2/2016 | Chen et al. |
| 2017/0019211 | A1 | 1/2017 | Noh et al. |
| 2018/0367162 | A1 | 12/2018 | Guyot et al. |
| 2019/0097654 | A1 | 3/2019 | Zhang et al. |
| 2019/0102569 | A1 | 4/2019 | Khandani |
| 2019/0108093 | A1 | 4/2019 | Presman et al. |
| 2019/0312593 | A1 | 10/2019 | Hsiao et al. |

OTHER PUBLICATIONS

Spencer, Quentin, H.; Error Correction Using a Message-Passing Decoder to Process Cyclic Redundancy Checks; IEEE Globecom 2006; Hazelwood, Missouri, 2006; consisting of 5 pages.

3GPP TS 38.212 V15.7.0; 3rd Generation Partnership Project; Technical Specification Group Radio Access Network; NR; Multiplexing and channel coding (Release 15); Sep. 2019; consisting of 101 pages.

Swedish Search Report and Written Opinion dated Dec. 23, 2020 for Patent Application No. 2030151-1; consisting of 7 pages.

Chinese Office Action and English Summary dated Apr. 22, 2024 for Application No. 202180023737.3, consisting of 10 pages.

3GPP TSG RAN WG1 Meeting #88bis R1-17024770; Title: Data channel encoding chain; Agenda Item: 8.1.4.1.1; Source: Intel Corporation; Document for: Decision; Location and Date: Spokane, USA Apr. 3-7, 2017, consisting of 3 pages.

Zhang; Journal of Nanjing University of Science and Technology "Construction of check matrix of LDPC code from shortened R S code" vol. 37 No. 5, Oct. 2013, consisting of 7 pages.

Zhang et al.; Electronic Design Engineering "A parallel CRC algorithm based on coefficient" vol. 26 No. 7, Apr. 2018, consisting of 5 pages.

Zanko et al., Robust Turbo Analog Error Correcting Codes Based on Analog CRC Verification; IEEE Transactions On Signal Processing, vol. 64, No. 3, Feb. 1, 2016, consisting of 14 pages.

Kurkov et al., Gravitational parity anomaly with and without boundaries; Published for SISSA by Springer, Mar. 13, 2018, consisting of 17 pages.

Aghili et al., Tracking and impersonating tags in a CRC-based ultralightweight RFID authentication protocol; Peer-to-Peer Networking and Applications; Springer Science+Business Media, LLC, Nov. 7, 2019, consisting of 9 pages.

* cited by examiner

VERIFYING DATA INTEGRITY IN A RECEIVER

CROSS-REFERENCE TO RELATED APPLICATIONS

This application is a Submission Under 35 U.S.C. § 371 for U.S. National Stage Patent Application of International Application No. PCT/EP2021/055684, filed Mar. 5, 2021 entitled "VERIFYING DATA INTEGRITY IN A RECEIVER," which claims priority to U.S. Provisional Application No. 62/993,152, filed Mar. 23, 2020, entitled "VERIFYING DATA INTEGRITY IN A RECEIVER," the entireties of both of which are incorporated herein by reference.

TECHNICAL FIELD

The present disclosure relates generally to the field of data integrity. More particularly, it relates to verifying data integrity in a receiver in a wireless communication network.

BACKGROUND

For verifying data integrity in a receiver, Cyclic Redundancy Checks, CRC, are often used to detect errors in messages that are transmitted over potentially unreliable channels in wireless communication networks, such as radio channels.

CRCs are often implemented in dedicated hardware but may also be implemented in software on processors.

A drawback of hardware and/or software implemented CRCs is that the amount of processing increases with the message length and renders processing inefficient in terms of processing time and incurred overhead.

Therefore, there is a need for alternative approaches for verifying data integrity in a receiver.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Generally, when an arrangement is referred to herein, it is to be understood as a physical product; e.g., an apparatus. The physical product may comprise one or more parts, such as controlling circuitry in the form of one or more controllers, one or more processors, or the like.

It is an object of some embodiments to solve or mitigate, alleviate, or eliminate at least some of the above or other drawbacks.

According to a first aspect, this is achieved by a method for verifying data integrity in a receiver in a wireless communication network.

The method comprises receiving a data message, wherein the data message comprises a group of data elements and a checksum, and computing a complete syndrome vector based on partial syndrome vectors, wherein the partial syndrome vectors are computed, in parallel, by multiplying part of a parity-check matrix with corresponding part of the received data message.

The method further comprises determining that all vector elements of the complete syndrome vector are zero, and verifying that the received data message is correct when all the vector elements of the complete syndrome vector are zero, and incorrect otherwise.

In some embodiments, the method further comprises partitioning the parity-check matrix into column groups and associating each column group with corresponding part of the data message, computing, in parallel, partial syndrome vectors by multiplying each column group with its corresponding part of the data message, and summing the computed partial syndrome vectors into a complete syndrome vector.

In some embodiments, the method further comprises partitioning the parity-check matrix into non-overlapping matrix element groups and associating each non-overlapping matrix element group with corresponding part of the data message, computing, in parallel, partial syndrome vectors by multiplying each non-overlapping matrix element group with its corresponding part of the data message, and summing the computed partial syndrome vectors into a complete syndrome vector.

In some embodiments, the method further comprises partitioning the parity-check matrix into non-overlapping matrix element groups from a column group and associating each non-overlapping matrix element group with corresponding part of the data message, computing, in parallel, partial syndrome vectors by multiplying each non-overlapping matrix element group from the column group with its corresponding part of the data message, and summing the computed partial syndrome vectors into a complete syndrome vector.

In some embodiments, the parity-check matrix is associated with the checksum polynomial, from which the parity-check matrix is computed.

In some embodiments, the checksum is based on the group of data elements and appended to the group of data elements in the data message to form a code word.

In some embodiments, the received data message has been computed and transmitted to the receiver by a transmitter.

In some embodiments, the checksum is one or more of: a Cyclic Redundancy Check, CRC, and a block code checksum.

In some embodiments, the complete syndrome vector comprising all zero vector elements is indicative of a matching checksum and/or an error-free group of data elements.

In some embodiments, the parity-check matrix is pre-computed and stored in a memory of the receiver and/or in a remote memory accessible to the receiver.

In some embodiments, the parity-check matrix is a binary matrix.

In some embodiments, the parity-check matrix comprises rows which are shifted versions of each other.

In some embodiments, given the part of the data message, a corresponding partial syndrome is computed by first reading the pre-computed part of the parity-check matrix from memory and initializing the partial syndrome vector.

In some embodiments, bits of the part of the data message are visited one by one, and when a one is encountered, a first set of bits of the parity-check matrix are added to the partial syndrome vector.

In some embodiments, bits of the part of the data message are visited one by one, and when a zero is encountered, the partial syndrome vector is maintained without changes.

In some embodiments, wherein each visited column in the parity-check matrix is a shifted version of a previous column where just one new bit is shifted in when each bit of the part of the data message and the part of the parity-check matrix has been visited.

In some embodiments, one or more processing elements and/or software threads for execution are assigned to one or more parts of the parity-check matrix with corresponding parts of the data message to compute the partial syndrome vectors in parallel.

A second aspect is a computer program product comprising a non-transitory computer readable medium, having thereon a computer program comprising program instructions. The computer program is loadable into a data processing unit and configured to cause execution of the method according to the first aspect when the computer program is run by the data processing unit.

A third aspect is an apparatus for verifying data integrity in a receiver in a wireless communication network.

The apparatus comprises a controller being configured to cause reception of a data message, wherein the data message comprises a group of data elements and a checksum, and computation of a complete syndrome vector based on partial syndrome vectors, wherein the partial syndrome vectors are computed, in parallel, by multiplication of part of a parity-check matrix with corresponding part of the received data message.

The controller being further configured to cause determination of that all vector elements of the complete syndrome vector are zero, and verification of that the received data message is correct when all the vector elements of the complete syndrome vector are zero, and incorrect otherwise.

In some embodiments, the controller is further configured to cause partitioning of the parity-check matrix into column groups and association of each column group with corresponding part of the data message, parallel computation of partial syndrome vectors by multiplication of each column group with its corresponding part of the data message, and summation of the computed partial syndrome vectors into a complete syndrome vector.

In some embodiments, the controller is further configured to cause partitioning of the parity-check matrix into non-overlapping matrix element groups and association of each non-overlapping matrix element group with corresponding part of the data message, parallel computation of partial syndrome vectors by multiplication of each non-overlapping matrix element group with its corresponding part of the data message, and summation of the computed partial syndrome vectors into a complete syndrome vector.

In some embodiments, the controller is further configured to cause partitioning of the parity-check matrix into non-overlapping matrix element groups from a column group and association of each non-overlapping matrix element group with corresponding part of the data message, parallel computation of partial syndrome vectors by multiplication of each non-overlapping matrix element group from the column group with its corresponding part of the data message, and summation of the computed partial syndrome vectors into a complete syndrome vector.

In some embodiments, the parity-check matrix is associated with the checksum polynomial, from which the parity-check matrix is computed.

In some embodiments, the checksum is based on the group of data elements and appended to the group of data elements in the data message to form a code word.

In some embodiments, the received data message has been computed and transmitted to the receiver by a transmitter.

In some embodiments, the checksum is one or more of: a Cyclic Redundancy Check, CRC, and a block code checksum.

In some embodiments, the complete syndrome vector comprising all zero vector elements is indicative of a matching checksum and/or an error-free group of data elements.

In some embodiments, the parity-check matrix is pre-computed and stored in a memory of the receiver and/or in a remote memory accessible to the receiver.

In some embodiments, the parity-check matrix is a binary matrix.

In some embodiments, the parity-check matrix comprises rows which are shifted versions of each other.

In some embodiments, the controller is further configured to cause, given the part of the data message, computation of a corresponding partial syndrome by a reading of the pre-computed part of the parity-check matrix from memory and initialization of the partial syndrome vector.

In some embodiments, the controller is further configured to cause bits of the part of the data message to be visited one by one, and when a one is encountered, a first set of bits of the parity-check matrix being added to the partial syndrome vector.

In some embodiments, the controller is further configured to cause bits of the part of the data message to be visited one by one, and when a zero is encountered, the partial syndrome vector being maintained without changes.

In some embodiments, the controller is further configured to cause the rows of the parity-check matrix to be shifted when each bit of the part of the data message has been visited.

In some embodiments, one or more processing elements and/or software threads for execution are assigned to one or more parts of the parity-check matrix with corresponding parts of the data message to compute the partial syndrome vectors in parallel.

In some embodiments, the apparatus is operably connectable to general-purpose hardware with one or more parallel processing elements configured to process the parallelized computations.

In some embodiments, each of the one or more parallel processing elements is configured to compute respective one or more of the partial syndrome vectors, in parallel, by multiplication of part of the parity-check matrix with corresponding part of the data message.

In some embodiments, the general-purpose hardware with one or more parallel processing elements is comprised in the receiver and/or in a cloud environment.

In some embodiments, the general-purpose hardware comprises a Graphics Processing Unit, GPU.

A fourth aspect is a receiver in a wireless communication network comprising the apparatus according to the third aspect.

In some embodiments, the receiver is configured to receive and verify integrity of data.

Any of the above aspects may additionally have features identical with or corresponding to any of the various features as explained above for any of the other aspects.

An advantage of some embodiments is that alternative approaches for verifying data integrity in a receiver are provided.

Another advantage of some embodiments is that parallelization of operations increases processing efficiency in terms of processing time and incurred overhead compared to what is possible according to prior art approaches.

Yet an advantage of some embodiments is that parallelization of operations enables processing elements in hardware to process operations independently and with different timings of each other.

Yet an advantage of some embodiments is that parallelization of operations enables more efficient implementation in terms of utilizing available resources in hardware compared to what is possible according to prior art approaches.

It should be noted that, even if embodiments are described herein in the context of verifying data integrity in a receiver, some embodiments may be equally applicable and/or beneficial also in other contexts.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

DETAILED DESCRIPTION

Figure 1:
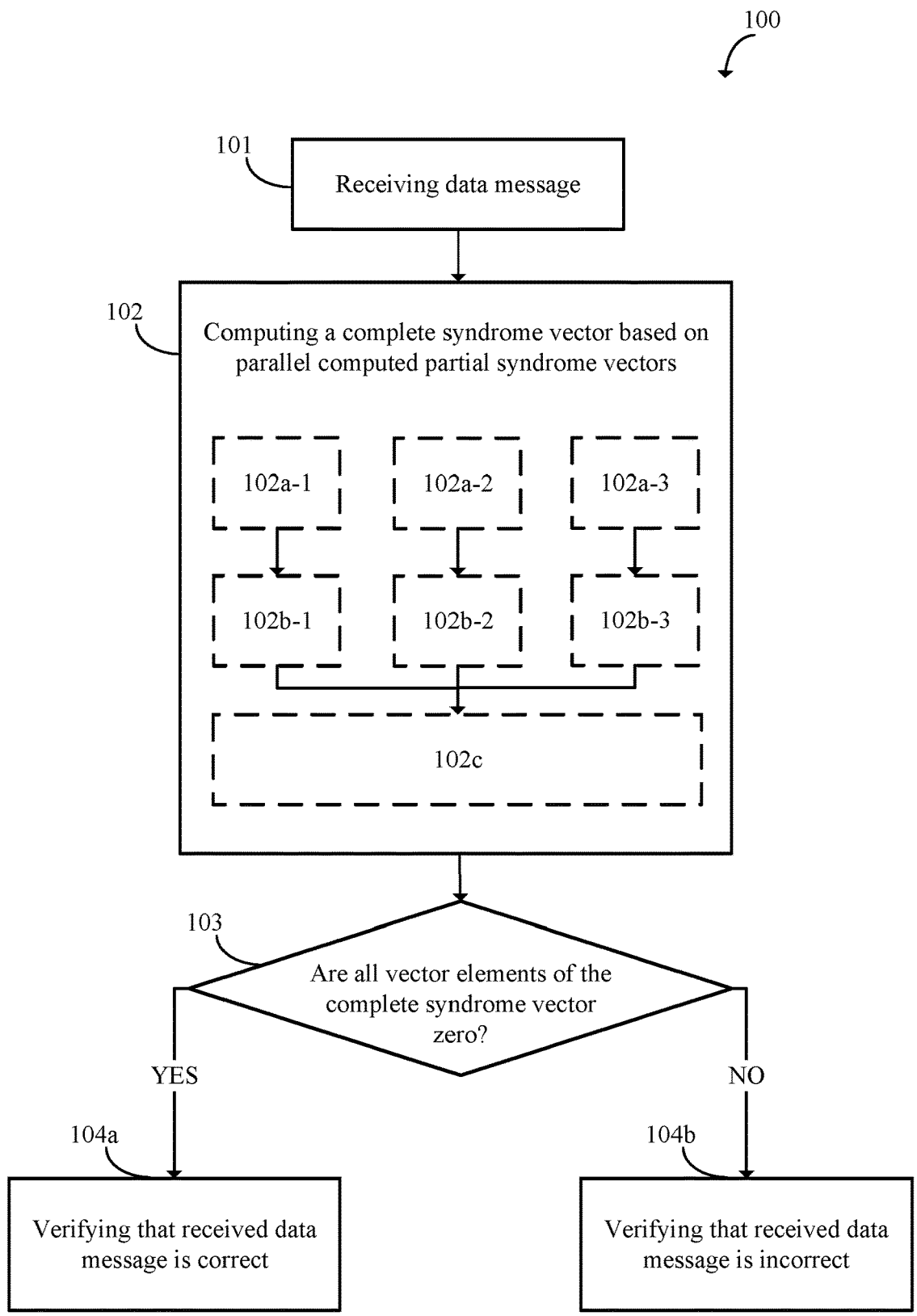
FIG. 1 is a flowchart illustrating example method steps according to some embodiments.

As already mentioned above, it should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

As mentioned above, a drawback of hardware and/or software implemented CRCs is that the amount of processing increases with the message length and renders processing inefficient in terms of processing time and incurred overhead.

In the following, embodiments will be presented where alternative approaches for verifying data integrity in a receiver are described.

General-purpose hardware, as described herein, typically comprises hardware comprising one or more parallel processing elements configured to process parallelized operations, wherein the one or more processing elements further comprise local data memory for processing the operations.

Operations, as described herein, typically comprises matrix and vector operations, wherein the operations may comprise matrix multiplications and computations of matrix products and the vector operations may comprise summation of matrix products.

Checksums, as described herein, typically comprises Cyclic Redundancy Check, CRC, and/or block code checksum.

CRC is typically implemented in a serial fashion, typically using some kind of shift register technique. The data message is processed piecewise while updating the shift register. At the end, the shift register state forms the checksum to be appended. In its most basic form, the data message is processed one bit at a time, but may also process a number of subsequent bits together, for instance 8 bits or 32 bits.

CRC computations may also be parallelized by splitting the data message into multiple sub-sequences and computing a temporary CRC for each sub-sequence. Then, a relatively complicated linear function is applied to each temporary CRC, and the final CRC is obtained by adding the results using XOR addition.

Since the amount of processing increases with the message length, the processing time can be long for long messages. This is especially true for software implementations. Hence, this makes it problematic to implement CRC on general-purpose processors.

As parallelization is based on serial computation for each sub-sequence, the complicated function that needs to be performed at the end for all sub-sequences adds additional computation burden and it is therefore difficult to compute the CRC efficiently on modern hardware comprising one or more processing elements.

It should be noted that, even if embodiments are described herein in the context of verifying data integrity in a receiver in a wireless communication network, wherein the receiver may be operably connectable to general-purpose hardware with one or more parallel processing elements configured to process parallelized computations, some embodiments may be equally applicable and/or beneficial also in other contexts wherein data integrity of received messages is verified with checksums.

It should further be noted that, even if embodiments are described herein in the context of general-purpose hardware with one or more parallel processing elements configured to process parallelized computations, some embodiments may be equally applicable and/or beneficial also in other contexts wherein each of the one or more processing elements are configured to process a set of computations in series.

It should furthermore be noted that, even if embodiments are described herein in the context of summing computed partial syndrome vectors into a complete syndrome vector, some embodiments may be equally applicable and/or beneficial also in other contexts wherein two or more of the computed partial syndrome vectors computed in one of the one or more parallel processing elements are also summed in the one parallel processing element, and wherein the summed two or more computed partial syndrome vectors form a sub-set of the computed partial syndrome vectors of which are summed into the complete syndrome vector.

FIG. 1 is a flowchart illustrating method steps of an example method 100 according to some embodiments. The method 100 is for verifying data integrity in a receiver in a wireless communication network. Thus, the method 100 may, for example, be performed by the apparatus 400 and/or the controller 410 of FIG. 4; all of which will be described later herein.

The method 100 comprises the following steps.

Figure 2A:
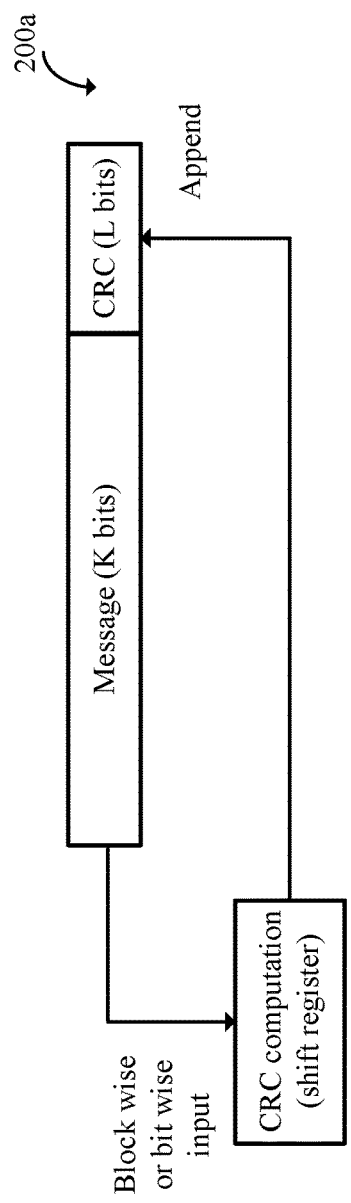
FIG. 2a is a schematic block diagram illustrating example operations according to some embodiments.
Figure 2B:
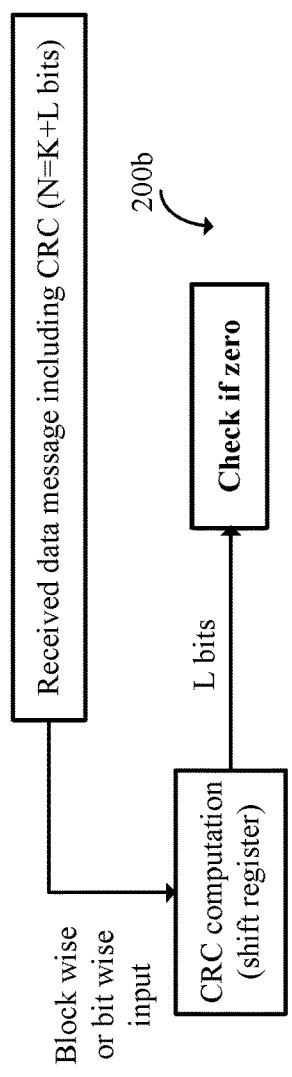
FIG. 2b is a schematic block diagram illustrating example operations according to some embodiments.
Figure 2C:
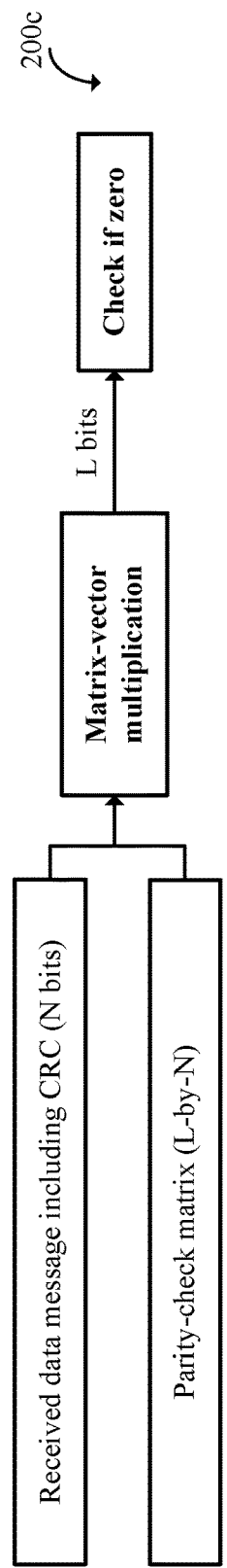
FIG. 2c is a schematic block diagram illustrating example operations according to some embodiments.

In step 101, a data message is received, wherein the data message comprises a group of data elements and a checksum (reference to FIGS. 2*a*-*c*).

Alternatively or additionally, the group of data elements may comprise a sequence of data elements.

In some embodiments, the received data message has been computed and transmitted to the receiver by a transmitter.

For example, the receiver receiving the message may be comprised in a mobile communication device and operate in a wireless communication network.

In some embodiments, the checksum is based on the group of data elements and appended to the group of data elements in the data message to form a code word (reference to FIG. 2*a*).

In some embodiments, the checksum is one or more of: a Cyclic Redundancy Check, CRC, and a block code checksum.

As mentioned above checksums, e.g. CRC, are typically used to detect errors in messages that are transmitted over potentially unreliable channels, such as radio channels. For instance, the 5G NR standard uses several different CRCs in the air interface; these are described in 3GPP TS 38.212, Section 5.1.

As mentioned above, CRC is a type of checksum, wherein the principle of checksums is for a transmitter to compute a sequence, i.e. a checksum, based on a group of data elements and append it to a data message comprising the group of data elements (reference to FIG. 2*a*).

The receiver then performs the same computation and checks, i.e. verifies, that the checksum matches, in which case the data message is declared error-free. If the checksum does not match, the non-matching checksum is indicative of that the data message contains errors and is typically discarded.

The receiver can mimic the transmitter by computing the CRC based on the received data message, and then compare it to the appended CRC sequence. Another way to check the CRC is to run the same CRC computation algorithm on the whole data message (including the CRC). In this case, the computed value should be zero.

CRC is a type of linear block code, where the transmitted data message including the checksum is seen as a code word. Further, CRCs are typically applied to binary sequences, and thus becomes binary linear block codes. CRCs may also be used on data messages over larger alphabets.

CRCs are mathematically defined in terms of long polynomial division. The divisor polynomial is based on the data message and the dividend is a fixed polynomial (the CRC polynomial). The quotient is discarded, and the resulting CRC sequence is obtained from the remainder.

Figure 3A:
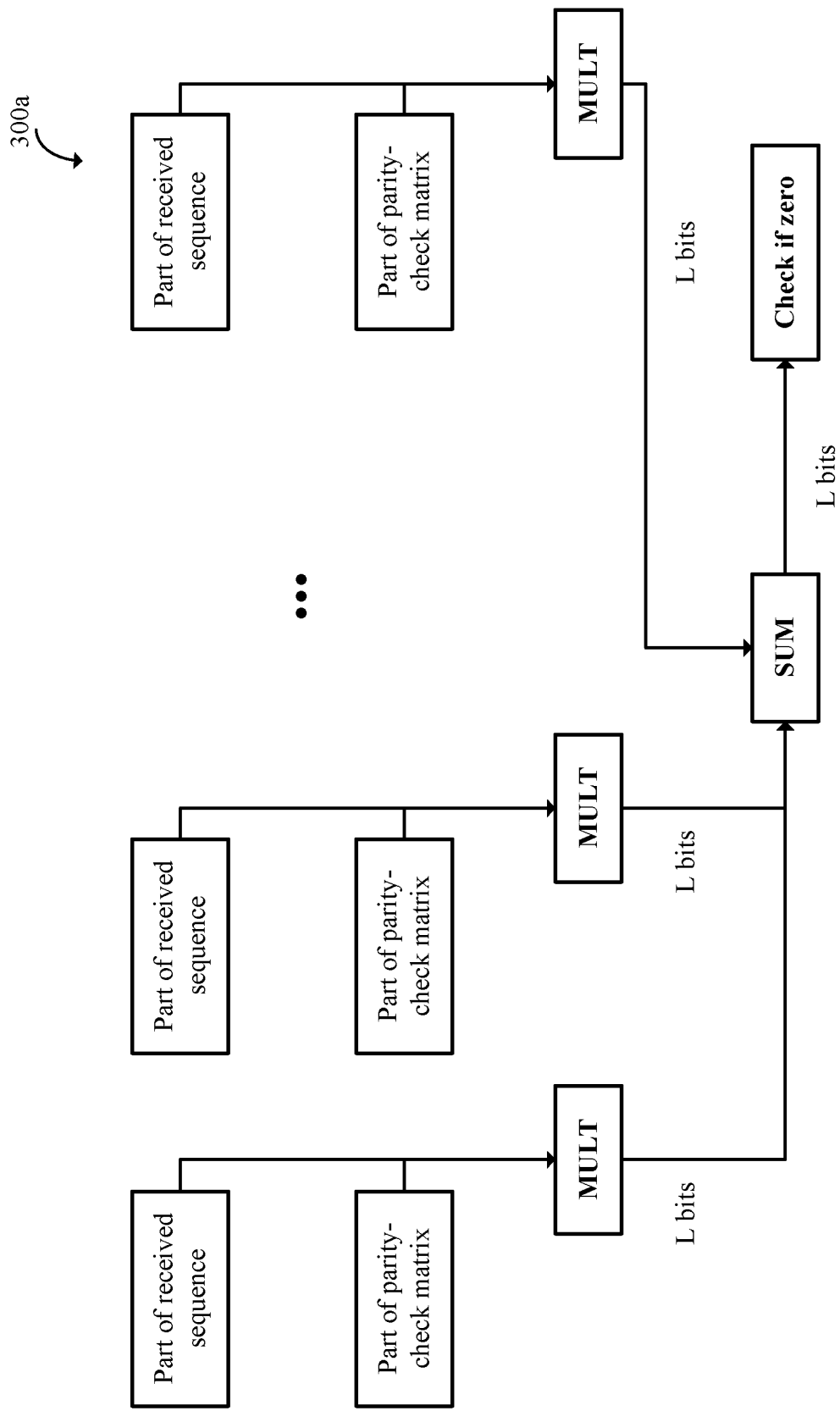
FIG. 3a is a schematic block diagram illustrating example operations according to some embodiments.
Figure 3B:
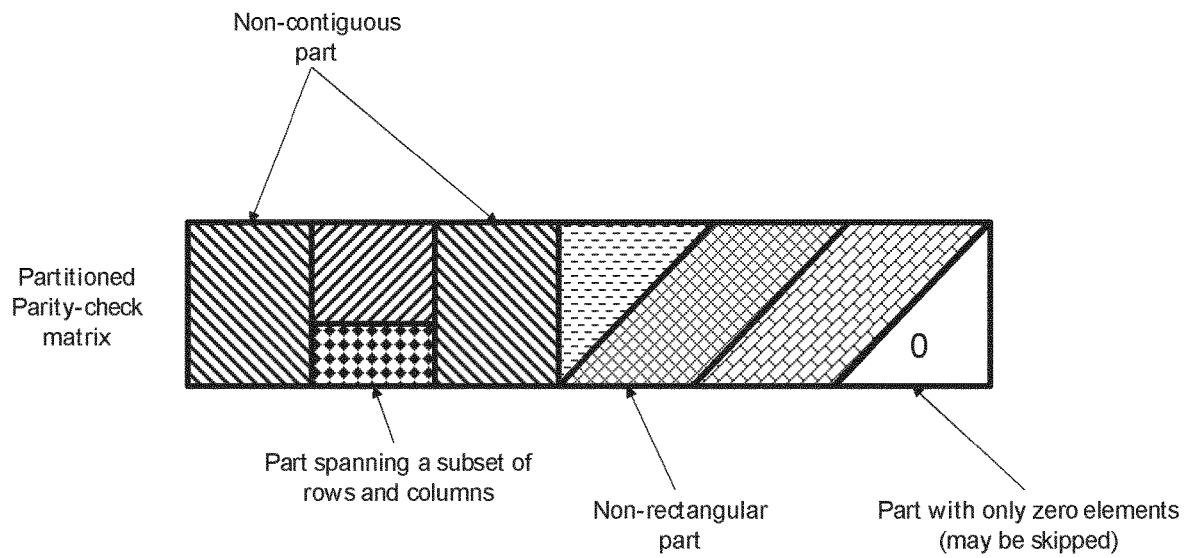
FIG. 3b is a schematic drawing illustrating an example part of a parity-check matrix according to some embodiments.
Figure 3C:
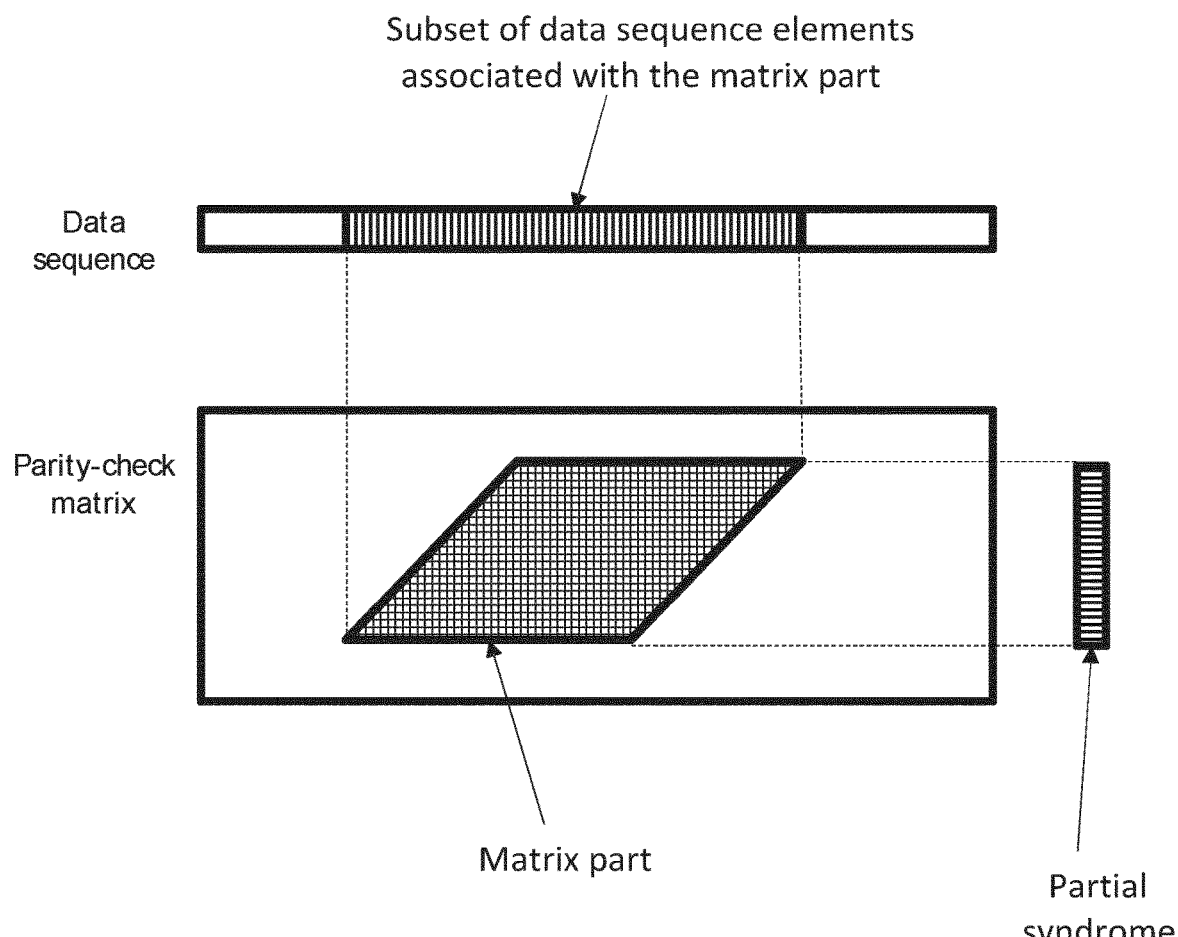
FIG. 3c is a schematic drawing illustrating an example part of a data message and an example part of a parity-check matrix according to some embodiments.

In step 102, a complete syndrome vector is computed based on partial syndrome vectors, wherein the partial syndrome vectors are computed, in parallel, by multiplying part of a parity-check matrix with corresponding part of the received data message (reference to FIGS. 3*a*-*c*).

In some embodiments, the parity-check matrix is associated with the checksum polynomial, e.g. the CRC polynomial, from which the parity-check matrix is computed.

In some embodiments, the parity-check matrix is a binary matrix.

In some embodiments, the parity-check matrix comprises rows which are shifted versions of each other.

Alternatively or additionally, this form of the parity-check matrix (i.e., rows being shifted versions of each other) only requires one row to be stored in memory, thus reducing the required memory size as well as the number of read operations.

In some embodiments, wherein each visited column in the parity-check matrix is a shifted version of a previous column where just one new bit is shifted in when each bit of the part of the data message and the part of the parity-check matrix has been visited.

Alternatively or additionally, the rows of the parity-check matrix may be generated from a linear feedback shift register whose feedback polynomial is the same as (or the reverse of) the polynomial that defines the CRC.

In some embodiments, bits of the part of the data message are visited one by one, and when a one is encountered, a first set of bits of the parity-check matrix are added to the partial syndrome vector.

In some embodiments, bits of the part of the data message are visited one by one, and when a zero is encountered, the partial syndrome vector is maintained without changes.

Alternatively or additionally, the complete syndrome vector is computed as a sum of the computed partial syndrome vectors (reference to FIGS. 3*a*-*c*).

Alternatively or additionally, the complete syndrome vector is indicative of the data integrity of the received data message.

In some embodiments, the complete syndrome vector comprising all zero vector elements is indicative of a matching checksum and/or an error-free group of data elements.

In some embodiments, the parity-check matrix is pre-computed and stored in a memory of the receiver and/or in a remote memory accessible to the receiver.

In some embodiments, given the part of the data message, a corresponding partial syndrome is computed by first reading the pre-computed part of the parity-check matrix from memory and initializing the partial syndrome vector.

In some embodiments, one or more processing elements and/or software threads for execution are assigned to one or more parts of the parity-check matrix with corresponding parts of the data message to compute the partial syndrome vectors in parallel.

In optional step 102*a*-1, in some embodiments, the parity-check matrix is partitioned into column groups and each column group is associated with corresponding part of the data message (reference to FIGS. 3*a*-*c*).

In optional step 102*b*-1, in some embodiments, partial syndrome vectors are computed, in parallel, by multiplying each column group with its corresponding part of the data message (reference to FIGS. 3*a*-*c*).

In optional step 102*a*-2, in some embodiments, the parity-check matrix is partitioned into non-overlapping matrix element groups and each non-overlapping matrix element group is associated with corresponding part of the data message (reference to FIGS. 3*a*-*c*).

Alternatively or additionally, all-zero matrix element groups may be discarded as their partial syndrome vector will be zero and would not contribute to the sum (reference to step 102*c*).

In optional step 102*b*-2, in some embodiments, partial syndrome vectors are computed, in parallel, by multiplying each non-overlapping matrix element group with its corresponding part of the data message (reference to FIGS. 3*a*-*c*)

In optional step 102*a*-3, in some embodiments, the parity-check matrix is partitioned into non-overlapping matrix element groups from a column group and each non-overlapping matrix element group is associated with corresponding part of the data message (reference to FIGS. 3a-c).

Alternatively or additionally, all-zero matrix element groups may be discarded as their partial syndrome vector will be zero and would not contribute to the sum (reference to step 102c).

In optional step 102b-3, in some embodiments, partial syndrome vectors are computed, in parallel, by multiplying each non-overlapping matrix element group from the column group with its corresponding part of the data message (reference to FIGS. 3a-c).

In optional step 102c, in some embodiments, the computed partial syndrome vectors are summed into a complete syndrome vector (reference to FIG. 3a).

For example, an implementation could compute 1000 partial syndrome vectors using only 100 parallel processing elements by having each parallel processing element compute 10 partial syndrome vectors after each other. Each parallel processing element could in turn compute a sum of its 10 partial syndrome vectors. Hence, the 100 partial syndrome vectors may be considered to be computed in parallel by the 100 parallel processing elements, each computing its partial syndrome vectors by iterating over a number of parts.

Alternatively or additionally, the sum of the partial syndrome vectors may be computed either by computing sums of subsets of the partial syndrome vectors in one or more parallel processing elements and thereafter summing the sums of the subsets into a complete syndrome vector or by computing the sum of the partial syndrome vectors computed by the one or more parallel processing elements into the complete syndrome vector.

In step 103, first alternative, all vector elements of the complete syndrome vector are determined to be zero, i.e. the complete syndrome vector being a zero vector, (YES-path out of step 103).

In step 103, second alternative, one or more of the vector elements of the complete syndrome vectors is determined to be non-zero, i.e. the complete syndrome vector being a non-zero vector, (NO-path out of step 103).

In step 104, (not shown), it is verified whether the received data message is correct or incorrect.

In step 104a, when all the vector elements of the complete syndrome vector are zero, i.e. a zero vector, it is verified that the received data message is correct (YES-path out of step 103).

In step 104b, when one or more of the vector elements of the complete syndrome vector are non-zero, i.e. a non-zero vector, it is verified that the received data message is incorrect (NO-path out of step 103).

Any of the above steps for FIG. 1 may additionally have features identical with or corresponding to any of the various features as explained below for FIGS. 2-5.

FIG. 2a is a schematic block diagram illustrating example operations according to some embodiments. The operations of the diagram 200a are performed in a transmitter, wherein the operations enable for verifying data integrity in a receiver in a wireless communication network.

Thus, the operations of the diagram 200a may, for example, be configured to perform one or more of the method steps of FIG. 1.

FIG. 2a illustrates a data message comprising a sequence of a checksum (CRC (L bits)) based on a group of data elements, i.e. sequence of data, (Message (K bits)) appended to the data message further comprising the group of data elements.

FIG. 2a further illustrates a CRC computation, wherein a block wise or bit wise input of the group of data elements is provided and the computed CRC is outputted and appended to the data message.

FIG. 2b is a schematic block diagram illustrating example operations according to some embodiments. The operations of the diagram 200b are for verifying data integrity in a receiver in a wireless communication network. Thus, the operations of the diagram 200b may, for example, be configured to perform one or more of the method steps of FIG. 1.

FIG. 2b illustrates a received data message comprising a CRC (N=K+L bits), wherein the CRC is computed for verifying data integrity, and wherein a block wise or bit wise input of the received data message including the CRC is provided as input to the computation and a vector (L bits) is outputted to verify that the vector comprises all zero vector elements.

FIG. 2c is a schematic block diagram illustrating example operations according to some embodiments. The operations of the diagram 200c are for verifying data integrity in a receiver in a wireless communication network. Thus, the operations of the diagram 200c may, for example, be configured to perform one or more of the method steps of FIG. 1.

FIG. 2c illustrates a received data message comprising a CRC (N bits) and a check-sum associated parity-check matrix (L-by-N), wherein the received data message and the check-sum associated parity-check matrix are multiplied in a matrix-vector multiplication and a vector (L bits) is outputted to verify that the vector comprises all zero vector elements.

FIG. 3a is a schematic block diagram illustrating example operations according to some embodiments. The operations of the diagram 300a are for verifying data integrity in a receiver in a wireless communication network. Thus, the operations of the diagram 300a may, for example, be configured to perform one or more of the method steps of FIG. 1.

FIG. 3a illustrates computing a complete syndrome vector based on partial syndrome vectors, wherein the partial syndrome vectors are computed, in parallel, by multiplying (MULT) part of a parity-check matrix with corresponding part of the received data message, i.e., part of received sequence and summing (SUM) the computed partial syndrome vectors into a complete syndrome vector.

FIG. 3a further illustrates determining that all vector elements of the complete syndrome vector are zero (Check if zero), and verifying that the received data message is correct when all the vector elements of the complete syndrome vector are zero, and incorrect otherwise.

The matrix operations, as described herein, may be applied on matrices of arbitrary size only limited by the size of local data memory associated to the one or more processing elements. To make the processing more efficient and the utilization of the one or more processing elements as high as possible, the matrices are split into parts for processing.

Any binary linear block code can be defined by a parity-check matrix, usually denoted H. H is an L×N binary matrix, where L is the number of added redundancy bits, N is the length of the code word, and K=N−L is the length of the data message. A binary sequence $\bar{c}$ of length N is a code word (indicating that the CRC is correct) if, and only if it fulfils the matrix equation $H\bar{c}^T$. A CRC is special case of a binary linear block code, wherein the redundancy bits are the computed CRC. Thus, L is the length of the CRC.

Parity-check matrices are not unique: if A is a non-singular L×L matrix then AH and H are parity-check matrices for the same code.

Thus, checking the CRC can be performed by calculating the length–L syndrome vector $\bar{s}=H\bar{c}^T$ and checking that it is all zero. Since all elements are binary, the matrix multiplication may be implemented through logical AND (i.e., binary multiplication) and logical XOR (i.e., binary addition). This enables both software and hardware implementation.

The computations may be parallelized in different ways, following items 1-3 describe the different computations:
1. Computing different parts of $\bar{s}$ in parallel, checking that each part is zero. This provides at most L-way parallelization.
2. Dividing the sequence $\bar{c}$ into M parts (M≤N) and computing corresponding partial sums, that are then summed together into $\bar{s}$. This provides at most N-way parallelization. The summing can be done partly in parallel in a tree, requiring log M final steps before checking $\bar{s}$. Each part could be a sub-sequence of $\bar{c}$, or it could an arbitrarily fragmented set of elements from $\bar{c}$.
3. A combination of 1 and 2, providing at most L×N-way parallelization.

Since L is typically a fixed small number (typically L≤32), and N can be in the order of several thousands, item 2 above can often provide parallelization enough in itself.

Assume then that the elements of H are $h_{ij}=q_{i+j}$, so that each row is the above row shifted one step to the left. This means that for a sequence of length N it requires storage of only N+L−1 precomputed parity check bits (or N by not storing L−1 starting zeros in the first row).

The syndrome vector $\bar{s}=H\bar{c}^T$ may be written as the (modulo-2) sum $$\bar{s} = \sum_{j=0}^{N-1} \bar{h}^{(j)} c_j,$$

where $\bar{h}^{(j)}$ is the j:th column of H. Given our assumption, we have $\bar{h}^{(j)}=(h_{0,j},\ldots,h_{L-1,j})=(q_j,\ldots,q_{j+L-1})$. Note that each term of this sum is either the all-zero vector (when $c_1=0$) or a sub-sequence of the q sequence (when $c_c=1$).

Given a sub-sequence $(c_b,\ldots,c_{b+m-1})$, the corresponding partial syndrome $$\bar{s}' = \sum_{j=b}^{b+m-1} \bar{h}^{(j)} c_j$$

may be computed by first reading the precomputed parity-check sequence $(q_b,\ldots,q_{b+m+L-1})$ from memory and initializing to the all-zero vector. Then the bits $c_b$, $c_{b+1}$, etc. are visited one by one: when a "one" is encountered the first L bits of the parity-check sequence are added to $\bar{s}$; when a "zero" is encountered $\bar{s}$ is left untouched. After visiting each bit, the parity-check sequence is shifted one step to the left.

Given a number of processing elements, i.e. one or more cores, each core can be assigned one or several sub-sequences of $\bar{c}$ to compute the partial syndrome sum over. For each such sub-sequence, the above method can be used. If the core is assigned multiple sub-sequences, it can simply iterate over those and sum up the partial syndromes. When the cores have finished their computations, their results can be summed together into a final sum, which is the overall syndrome.

FIG. 3b is a schematic drawing illustrating an example part of a parity-check matrix according to some embodiments.

FIG. 3b illustrates a partitioned parity-check matrix comprising elements corresponding to parts of which may be multiplied with corresponding parts of a data message, e.g. subset of data sequence elements.

FIG. 3b further illustrates parts of the partitioned parity-check matrix comprising one or more of non-contiguous parts, part spanning a subset of rows and columns, non-rectangular part, and part with only zero-elements (which may be skipped).

FIG. 3c is a schematic drawing illustrating an example part of a data message and an example part of a parity-check matrix according to some embodiments.

FIG. 3c illustrates a parity-check matrix, wherein the parity check matrix is partitioned and wherein the partitioned matrix part corresponds to a part of a data message, i.e. a subset of a data sequence comprising elements associated with the partitioned matrix part.

FIG. 3c further illustrates a partial syndrome vector, i.e. partial syndrome, wherein the partial syndrome vector is computed by multiplying the partitioned matrix part with the corresponding part of the data message, i.e. the subset of a data sequence comprising elements associated with the partitioned matrix part.

It should be noted that, the computations of the partial syndrome vectors are performed in parallel and may be performed by hardware comprising one or more processing elements, e.g. a GPU, wherein the one or more processing elements are configured to perform computations in parallel.

The hardware comprising the one or more processing elements is therefore configured to minimize the processing time and by utilizing the one or more processing elements for parallel computations, the computations will be timing independent.

Figure 4:
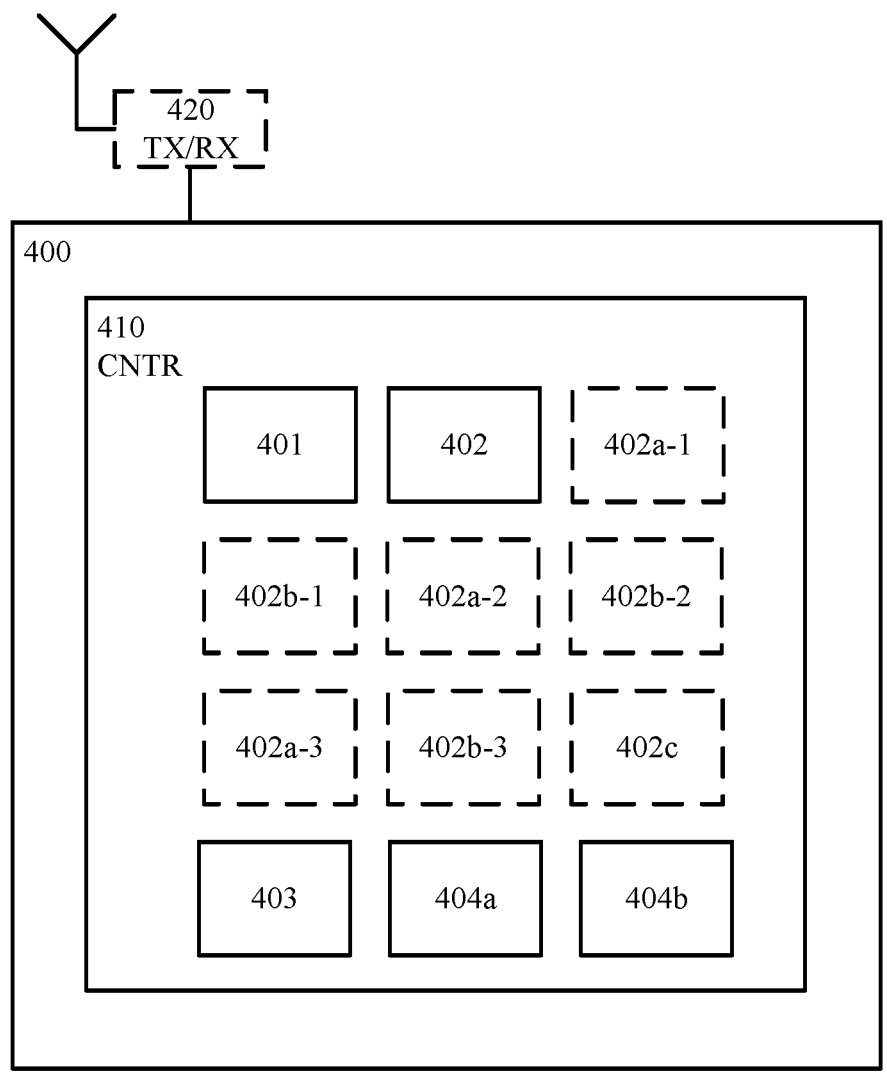
FIG. 4 is a schematic block diagram illustrating an example apparatus according to some embodiments.

FIG. 4 is a schematic block diagram illustrating an example apparatus 400 according to some embodiments. The apparatus 400 is for verifying data integrity in a receiver in a wireless communication network. Thus, the apparatus 400 and/or the controller 410 may, for example, be configured to perform one or more of the method steps of FIG. 1, and/or one or more of any steps otherwise described herein.

The apparatus 400 comprises a controller 410, e.g. device controlling circuitry, configured to cause reception of a data message, wherein the data message comprises a group of data elements and a checksum, and computation of a complete syndrome vector based on partial syndrome vectors, wherein the partial syndrome vectors are computed, in parallel, by multiplication of part of a parity-check matrix with corresponding part of the received data message.

The controller 410 is further configured to cause determination of that all vector elements of the complete syndrome vector are zero, and verification of that the received data message is correct when all the vector elements of the complete syndrome vector are zero, and incorrect otherwise.

The apparatus 400 comprises, as mentioned above, the controller (CNTR; e.g., control circuitry or a controlling module) 410, which may in turn comprise, (or be otherwise associated with; e.g., connected or connectable to), a receiver 401, e.g. receiving circuitry or receiving module, configured to receive a data message, wherein the data message comprises a group of data elements and a checksum (compare with step 101 of FIG. 1).

The controller 410 further comprises, (or is otherwise associated with; e.g., connected or connectable to), a computer 402, e.g. computing circuitry or computing module, configured to compute a complete syndrome vector based on partial syndrome vectors, wherein the partial syndrome vectors are computed, in parallel, by multiplication of part of a parity-check matrix with corresponding part of the received data message (compare with step 102 of FIG. 1).

The controller 410 further comprises, (or is otherwise associated with; e.g., connected or connectable to), a determiner 403, e.g. determining circuitry or determining module, configured to determine that all vector elements of the complete syndrome vector are zero (compare with step 103 of FIG. 1).

The controller 410 further comprises, (or is otherwise associated with; e.g., connected or connectable to), verifiers 404a and 404b, e.g. verifying circuitry or verifying modules, configured to verify that the received data message is correct when all the vector elements of the complete syndrome vector are zero (compare with step 104b of FIG. 1), and incorrect otherwise (compare with step 104b of FIG. 1).

In some embodiments, the controller 410 further comprises, (or is otherwise associated with; e.g., connected or connectable to), a partitioner 402a-1, e.g. partitioning circuitry or partitioning module, configured to partition the parity-check matrix into column groups and associating each column group with corresponding part of the data message (compare with step 102a-1 of FIG. 1), and computer 402b-1, e.g. computing circuitry or computing module, configured to compute, in parallel, partial syndrome vectors by multiplying each column group with its corresponding part of the data message (compare with step 102b-1 of FIG. 1).

In some embodiments, the controller 410 further comprises, (or is otherwise associated with; e.g., connected or connectable to), a partitioner 402a-2, e.g. partitioning circuitry or partitioning module, configured to partition the parity-check matrix into non-overlapping matrix element groups and associating each non-overlapping matrix element group with corresponding part of the data message (compare with step 102a-2 of FIG. 1), and a computer 402b-2, e.g. computing circuitry or computing module, configured to compute, in parallel, partial syndrome vectors by multiplying each non-overlapping matrix element group with its corresponding part of the data message (compare with step 102b-2 of FIG. 1).

In some embodiments, the controller 410 further comprises, (or is otherwise associated with; e.g., connected or connectable to), a partitioner 402a-3, e.g. partitioning circuitry or partitioning module, configured to partition the parity-check matrix into non-overlapping matrix element groups from a column group and associating each non-overlapping matrix element group with corresponding part of the data message (compare with step 102a-3 of FIG. 1), and a computer 402b-3, e.g. computing circuitry or computing module, configured to compute, in parallel, partial syndrome vectors by multiplying each non-overlapping matrix element group from the column group with its corresponding part of the data message (compare with step 102b-3 of FIG. 1).

In some embodiments, the controller 410 furthermore comprises, (or is otherwise associated with; e.g., connected or connectable to), a summer 402c, e.g. summing circuitry or summing module, configured to sum the computed partial syndrome vectors into a complete syndrome vector (compare with step 102c of FIG. 1).

In some embodiments, the apparatus is operably connectable to general-purpose hardware with one or more parallel processing elements configured to process the parallelized computations.

In some embodiments, each of the one or more parallel processing elements is configured to compute respective one or more of the partial syndrome vectors, in parallel, by multiplication of part of the parity-check matrix with corresponding part of the data message.

In some embodiments, the general-purpose hardware with one or more parallel processing elements is comprised in the receiver and/or in a cloud environment.

In some embodiments, the general-purpose hardware comprises a Graphics Processing Unit, GPU.

The apparatus 400 may further optionally comprise, (or be otherwise associated with; e.g., connected or connectable to), in some embodiments, a transceiver TX/RX 420, e.g. transceiving circuitry or transceiving module, configured to transmit and receive radio signals e.g. in accordance with the verifying of data integrity in a receiver in a wireless communication network.

Generally, when an arrangement is referred to herein, it is to be understood as a physical product; e.g., an apparatus. The physical product may comprise one or more parts, such as controlling circuitry in the form of one or more controllers, one or more processors, or the like.

The described embodiments and their equivalents may be realized in software or hardware or a combination thereof. The embodiments may be performed by general purpose circuitry. Examples of general purpose circuitry include digital signal processors (DSP), central processing units (CPU), Graphics Processing Units (GPU), co-processor units, field programmable gate arrays (FPGA) and other programmable hardware. Alternatively or additionally, the embodiments may be performed by specialized circuitry, such as application specific integrated circuits (ASIC). The general purpose circuitry and/or the specialized circuitry may, for example, be associated with or comprised in an apparatus such as a wireless communication device.

Embodiments may appear within an electronic apparatus (such as a wireless communication device) comprising arrangements, circuitry, and/or logic according to any of the embodiments described herein. Alternatively or additionally, an electronic apparatus (such as a wireless communication device) may be configured to perform methods according to any of the embodiments described herein.

According to some embodiments, a computer program product comprises a computer readable medium such as, for example a universal serial bus (USB) memory, a plug-in card, an embedded drive or a read only memory (ROM).

Figure 5:
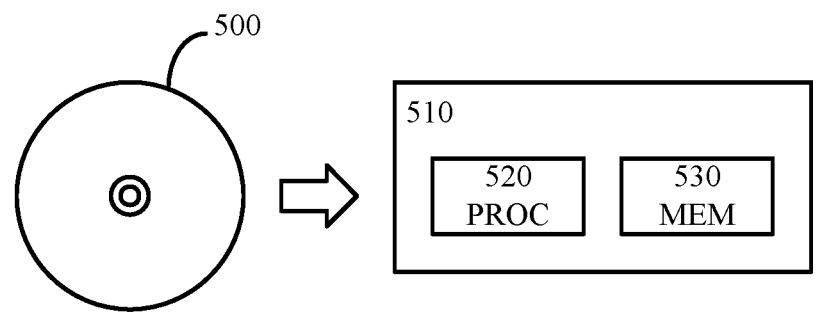
FIG. 5 is a schematic drawing illustrating an example computer readable medium according to some embodiments.

FIG. 5 illustrates an example computer readable medium in the form of a compact disc (CD) ROM 500. The computer readable medium has stored thereon a computer program comprising program instructions. The computer program is loadable into a data processor (PROC) 520, which may, for example, be comprised in a wireless communication device 510. When loaded into the data processor, the computer program may be stored in a memory (MEM) 530 associated with or comprised in the data processor.

In some embodiments, the computer program may, when loaded into and run by the data processing unit, cause execution of method steps according to, for example, FIG. 1 and/or one or more of any steps otherwise described herein.

In some embodiments, the computer program may, when loaded into and run by the data processing unit, cause execution of operations according to, for example, FIGS. 2a-c, and/or FIG. 3a and/or one or more of any operations otherwise described herein.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the method embodiments described herein discloses example methods through steps being performed in a certain order. However, it is recognized that these sequences of events may take place in another order without departing from the scope of the claims. Furthermore, some method steps may be performed in parallel even though they have been described as being performed in sequence. Thus, the steps of any methods disclosed herein do not have to be performed in the exact order disclosed, unless a step is explicitly described as following or preceding another step and/or where it is implicit that a step must follow or precede another step.

In the same manner, it should be noted that in the description of embodiments, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. A method for verifying data integrity in a receiver in a wireless communication network, the method comprising:
    receiving by a radio transceiver a data message, the data message comprising a group of data elements and a checksum, the checksum being a Cyclic Redundancy Check, CRC;
    determining a complete syndrome vector based on partial syndrome vectors, the partial syndrome vectors being computed in parallel by parallel processing elements by multiplying part of a parity-check matrix with a corresponding part of the received data message, the parity-check matrix being associated with a checksum polynomial from which the parity-check matrix is computed, each visited column in the parity-check matrix being a shifted version of a previous column where just one new bit is shifted in when each bit of the corresponding part of the data message and the part of the parity-check matrix has been visited;
    determining that all vector elements of the complete syndrome vector are zero; and
    verifying that the received data message is correct when all the vector elements of the complete syndrome vector are zero, and incorrect otherwise.

2. The method according to claim 1, further comprising:
    partitioning the parity-check matrix into column groups and associating each column group with corresponding part of the data message;
    computing, in parallel, partial syndrome vectors by multiplying each column group with its corresponding part of the data message; and
    summing the computed partial syndrome vectors into a complete syndrome vector.

3. The method according to claim 2, further comprising:
    partitioning the parity-check matrix into non-overlapping matrix element groups and associating each non-overlapping matrix element group with corresponding part of the data message;
    computing, in parallel, partial syndrome vectors by multiplying each non-overlapping matrix element group with its corresponding part of the data message; and
    summing the computed partial syndrome vectors into a complete syndrome vector.

4. The method according to claim 2, further comprising:
    partitioning the parity-check matrix into non-overlapping matrix element groups from a column group and associating each non-overlapping matrix element group with corresponding part of the data message;
    computing, in parallel, partial syndrome vectors by multiplying each non-overlapping matrix element group from the column group with its corresponding part of the data message; and
    summing the computed partial syndrome vectors into a complete syndrome vector.

5. The method according to claim 2, wherein the checksum is one or more of: a Cyclic Redundancy Check, CRC, and a block code checksum.

6. The method according to claim 2, wherein the complete syndrome vector comprising all zero vector elements is indicative of at least one of a matching checksum and an error-free group of data elements.

7. The method according to claim 2, wherein the parity-check matrix is pre-computed and stored in at least one of a memory of the receiver and in a remote memory accessible to the receiver.

8. The method according to claim 1, further comprising:
    partitioning the parity-check matrix into non-overlapping matrix element groups and associating each non-overlapping matrix element group with corresponding part of the data message;
    computing, in parallel, partial syndrome vectors by multiplying each non-overlapping matrix element group with its corresponding part of the data message; and
    summing the computed partial syndrome vectors into a complete syndrome vector.

9. The method according to claim 1, further comprising:
    partitioning the parity-check matrix into non-overlapping matrix element groups from a column group and associating each non-overlapping matrix element group with corresponding part of the data message;
    computing, in parallel, partial syndrome vectors by multiplying each non-overlapping matrix element group from the column group with its corresponding part of the data message; and
    summing the computed partial syndrome vectors into a complete syndrome vector.

10. The method according to claim 1, wherein the checksum is one or more of: a Cyclic Redundancy Check, CRC, and a block code checksum.

11. The method according to claim 1, wherein the complete syndrome vector comprising all zero vector elements is indicative of at least one of a matching checksum and an error-free group of data elements.

12. The method according to claim 1, wherein the parity-check matrix is pre-computed and stored in at least one of a memory of the receiver and in a remote memory accessible to the receiver.

13. The method according to claim 1, wherein the parity-check matrix is a binary matrix.

14. The method according to claim 1, wherein the parity-check matrix comprises rows which are shifted versions of each other.

15. The method according to claim 1, wherein given the part of the data message, a corresponding partial syndrome is computed by first reading the pre-computed part of the parity-check matrix from memory and initializing the partial syndrome vector.

16. The method according to claim 1, wherein bits of the part of the data message are visited one by one, and when a one is encountered, a first set of bits of the parity-check matrix are added to the partial syndrome vector.

17. The method according to claim 1, wherein bits of the part of the data message are visited one by one, and when a zero is encountered, the partial syndrome vector is maintained without changes.

18. The method according to claim 1, wherein one or more processing elements and/or software threads for execution are assigned to one or more parts of the parity-check matrix with corresponding parts of the data message to compute the partial syndrome vectors in parallel.

19. A non-transitory computer readable storage medium, having thereon a computer program comprising program instructions, the computer program being loadable into a data processing unit and configured to perform a method for verifying data integrity in a receiver in a wireless communication network when the computer program is run by the data processing unit, the method comprising:
   receiving a data message, the data message comprising a group of data elements and a checksum, the checksum being a Cyclic Redundancy Check, CRC;
   computing a complete syndrome vector based on partial syndrome vectors, the partial syndrome vectors being computed in parallel by parallel processing elements by multiplying part of a parity-check matrix with a corresponding part of the received data message, the parity-check matrix being associated with a checksum polynomial from which the parity-check matrix is computed, each visited column in the parity-check matrix being a shifted version of a previous column where just one new bit is shifted in when each bit of the part of the data message and the part of the parity-check matrix has been visited;
   determining that all vector elements of the complete syndrome vector are zero; and
   verifying that the received data message is correct when all the vector elements of the complete syndrome vector are zero, and incorrect otherwise.

20. A receiver in a wireless communication network comprising an apparatus for verifying data integrity in a receiver in a wireless communication network, the apparatus comprising a controller configured to cause:
   reception of a data message, the data message comprising a group of data elements and a checksum, the checksum being a Cyclic Redundancy Check, CRC;
   determination of a complete syndrome vector based on partial syndrome vectors, the partial syndrome vectors being computed in parallel by parallel processing elements by multiplication of part of a parity-check matrix with corresponding part of the received data message, the parity-check matrix being associated with a checksum polynomial from which the parity-check matrix is computed, each visited column in the parity-check matrix being a shifted version of a previous column where just one new bit is shifted in when each bit of the corresponding part of the data message and the part of the parity-check matrix has been visited;
   determination of that all vector elements of the complete syndrome vector are zero; and
   verification of that the received data message is correct when all the vector elements of the complete syndrome vector are zero, and incorrect otherwise.

* * * * *